United States Patent
Yamazaki et al.

(10) Patent No.: US 9,851,149 B2
(45) Date of Patent: Dec. 26, 2017

(54) MAGNETIC ANNEALING APPARATUS AND MAGNETIC ANNEALING METHOD

(71) Applicant: Tokyo Electron Limited, Tokyo (JP)

(72) Inventors: Mitsuru Yamazaki, Iwate (JP); Barry Clarke, Dublin (IE); Jattie Van Der Linde, Dublin (IE); Makoto Saito, Iwate (JP); Kazuyoshi Sugawara, Iwate (JP); Toshiji Abe, Iwate (JP); Tadashi Enomoto, Iwate (JP)

(73) Assignee: Tokyo Electron Limited, Tokyo (JP)

(*) Notice: Subject to any disclaimer, the term of this patent is extended or adjusted under 35 U.S.C. 154(b) by 134 days.

(21) Appl. No.: 14/836,047

(22) Filed: Aug. 26, 2015

(65) Prior Publication Data

US 2016/0061525 A1 Mar. 3, 2016

(30) Foreign Application Priority Data

Aug. 29, 2014 (JP) .................................. 2014-176436

(51) Int. Cl.
*C30B 23/02* (2006.01)
*F27B 17/00* (2006.01)
(Continued)

(52) U.S. Cl.
CPC .......... *F27B 17/0025* (2013.01); *F27D 11/12* (2013.01); *F27D 99/0001* (2013.01);
(Continued)

(58) Field of Classification Search
CPC .............. C30B 23/02; C30B 1/04; C30B 1/02
See application file for complete search history.

(56) References Cited

U.S. PATENT DOCUMENTS

2004/0218913 A1* 11/2004 Melgaard ................. F27B 5/04
392/418
2005/0023266 A1* 2/2005 Ueno ................ H01L 21/67109
219/390
(Continued)

FOREIGN PATENT DOCUMENTS

| JP | 2004-263206 A | 9/2004 |
|---|---|---|
| TW | 200732613 A | 9/2007 |
| TW | 201421585 A | 6/2014 |

*Primary Examiner* — Robert M Kunemund
(74) *Attorney, Agent, or Firm* — Abelman, Frayne & Schwab

(57) ABSTRACT

Disclosed is a magnetic annealing apparatus including a processing container that performs a magnetic annealing processing on a plurality of substrates accommodated therein in a magnetic field; a substrate holder that holds the plurality of substrates substantially horizontally in the processing container; a division heater including a plurality of sub-division heaters and covering a substantially entire circumferential surface of an outer periphery of a predetermined region of the processing container along a longitudinal direction; a magnet installed to cover an outside of the division heater; and a controller configured to feedback-control a temperature of a predetermined control target heater among the plurality of sub-division heaters, and to control temperatures of the plurality of sub-division heaters other than the predetermined control target heater based on a control output obtained by multiplying a control output of the predetermined control target heater and a predetermined ratio.

14 Claims, 6 Drawing Sheets

(51) Int. Cl.
  *F27D 99/00*    (2010.01)
  *H01L 43/12*    (2006.01)
  *F27D 11/12*    (2006.01)
  *H01L 21/67*    (2006.01)

(52) U.S. Cl.
  CPC .. *H01L 21/67115* (2013.01); *H01L 21/67248* (2013.01); *H01L 43/12* (2013.01)

(56) References Cited

U.S. PATENT DOCUMENTS

2006/0022387 A1\* 2/2006 Ueno ............... F27B 14/08
                                          266/104
2009/0323410 A1\* 12/2009 Li .................. B82Y 25/00
                                          365/171
2010/0176470 A1\* 7/2010 Horng ............... H01L 43/08
                                          257/421

\* cited by examiner

MAGNETIC ANNEALING APPARATUS AND MAGNETIC ANNEALING METHOD

CROSS-REFERENCE TO RELATED APPLICATIONS

This application is based on and claims priority from Japanese Patent Application No. 2014-176436, filed on Aug. 29, 2014 with the Japan Patent Office, the disclosure of which is incorporated herein in its entirety by reference.

TECHNICAL FIELD

The present disclosure relates to a magnetic annealing apparatus and a magnetic annealing method.

BACKGROUND

A magnetic random access memory (MRAM), which is one of non-volatile memories, recently attracts attention as a next generation semiconductor memory device. The MRAM is fabricated by performing a heat treatment (magnetic annealing) on a magnetic material film formed on a workpiece to be processed ("workpiece") which is, for example, a semiconductor wafer ("wafer") in a strong magnetic field to exhibit a magnetic property of the material film.

For example, Japanese Patent Laid-Open Publication No. 2004-263206 discloses a magnetic annealing apparatus which uses a solenoid type magnetic as a means for generating a magnetic field for performing a magnet annealing processing and requires a relatively small installation area.

SUMMARY

According to an aspect of the present disclosure, there is provided a magnetic annealing apparatus comprising: a processing container having a horizontally-elongated tubular shape and configured to perform a magnetic annealing processing on a plurality of substrates accommodated therein in a magnetic field; a substrate holder configured to hold the plurality of substrates substantially horizontally in the processing container such that the plurality of substrates are stacked vertically; a division heater including a plurality of sub-division heaters and configured to cover a substantially entire circumferential surface of an outer periphery of a predetermined region of the processing container along a longitudinal direction with the plurality of sub-division heaters; a magnet installed to cover an outside of the division heater; and a controller configured to feedback-control a temperature of a predetermined control target heater among the plurality of sub-division heaters, and to control temperatures of the plurality of sub-division heaters other than the predetermined control target heater based on a control output obtained by multiplying a control output of the predetermined control target heater and a predetermined ratio.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In FIG. 2, (a) is a perspective view illustrating the entire configuration of the boat loader, and (b) is a view illustrating a configuration of a heat shielding plate in an enlarged scale.

FIG. 3A is a front view the inside of the heater of the magnetic annealing apparatus according to the exemplary embodiment. FIG. 3B is a side view of the heater of the magnetic annealing apparatus according to the exemplary embodiment. FIG. 3C is a perspective view of the inside of the heater of the magnetic annealing apparatus according to the exemplary embodiment.

DETAILED DESCRIPTION

Figure 1:
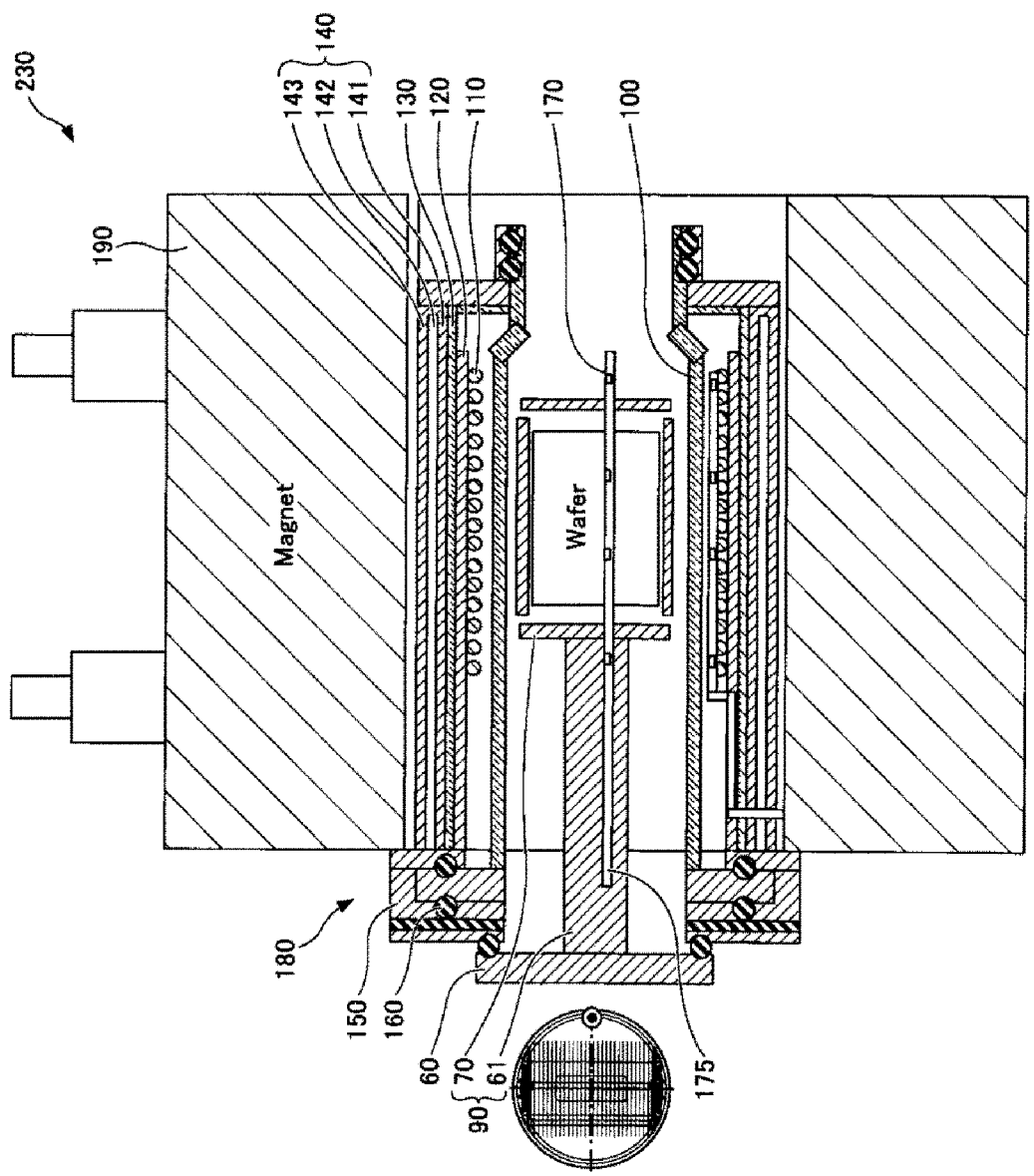
FIG. 1 is a cross-sectional view illustrating a whole configuration of a magnetic annealing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The magnetic annealing apparatus disclosed in Japanese Patent Laid-Open Publication No. 2004-263206 is a small-scale apparatus for use in research and development for a hard disk drive (HDD) or an MRAM and is not aimed at mass production. Considering an MRAM market size expected in the forthcoming years, what is requested is to develop a magnetic annealing apparatus which may continuously or semi-continuously process a plurality (e.g., one hundred sheets) of wafers. While it is necessary for the MRAM to strictly align the magnetic direction, the adoption space in a magnetic field generated by a magnet is very narrow. Therefore, a heating unit of the magnetic annealing apparatus is required to be very compact. Further, the temperature control is required to be configured as simply as possible. Meanwhile, in order to uniformly heat the plurality of wafers, it is necessary to raise the temperature of all the wafers at a uniform gradient regardless of the mounting positions of the wafers and to stabilize the temperature at an early stage, thereby continuing the uniform heating.

Accordingly, an object of the present disclosure is to provide a magnetic annealing apparatus which has a simple temperature control configuration and is able to extremely reduce a convergence time from a start of heating to a temperature stabilization, and a magnetic annealing method.

According to an exemplary embodiment of the present disclosure, there is provided a magnetic annealing apparatus comprising: a processing container having a horizontally-elongated tubular shape and configured to perform a magnetic annealing processing on a plurality of substrates accommodated therein in a magnetic field; a substrate holder configured to hold the plurality of substrates substantially horizontally in the processing container such that the plurality of substrates are stacked vertically; a division heater including a plurality of sub-division heaters and configured to cover a substantially entire circumferential surface of an outer periphery of a predetermined region of the processing container along a longitudinal direction with the plurality of sub-division heaters; a magnet installed to cover an outside of the division heater; and a controller configured to feedback-control a temperature of a predetermined control target heater among the plurality of sub-division heaters, and to control temperatures of the plurality of sub-division heaters other than the predetermined control target heater based on a control output obtained by multiplying a control output of the predetermined control target heater and a predetermined ratio.

In the magnetic annealing apparatus described above, a plurality of the division heaters is installed in the longitudinal direction. A predetermined control target heater is selected for each predetermined region along the longitudinal direction.

In the magnetic annealing apparatus described above, the predetermined control target heater and the plurality of sub-division heaters other than the predetermined control target heater are arranged symmetrically with respect to the center of each of the substrates in a direction perpendicular to the longitudinal direction.

In the magnetic annealing apparatus described above, the temperature of the predetermined control target heaters is feedback-controlled based on a temperature detection result of a temperature detector installed in the processing container.

In the magnetic annealing apparatus described above, the temperature detector is installed at a position closest to the predetermined control target heater.

In the magnetic annealing apparatus as described above, the control output is an output that controls a heater power of each of the plurality of sub-division heaters.

In the magnetic annealing apparatus as described above, the controller includes: a temperature control unit configured to control the heater power of the predetermined control target heater by a feedback control; and an output conversion unit configured to perform an output conversion by multiplying the heater power of the predetermined control target heater and the predetermined ratio.

The magnetic annealing apparatus described above further includes surrounding heaters configured to surround the entire circumference at both ends of the division heater in the longitudinal direction. The controller feedback-controls temperatures of the surrounding heaters.

In the magnetic annealing apparatus described above, the division heaters is configured with four sub-division heaters that cover an upper surface, a lower surface, a right side surface, and a left side surface of the processing container, respectively. The sub-division heaters that cover the right side surface and the left side surface are the predetermined control target heaters.

The magnetic annealing apparatus described above further includes a heat shielding plate arranged to cover an upper surface and a lower surface of the substrate holder and configured to shield heat from the sub-division heater that covers the upper surface of the processing container and the sub-division heater that covers the lower surface of the processing container. The controller sets the predetermined ratios of the sub-division heater that covers the upper surface of the processing container and the sub-division heater that covers the lower surface of the processing container to a value larger than 1 at the beginning of the magnetic annealing processing.

In the magnetic annealing apparatus described above, the controller sets the predetermined ratio to 1 when a predetermined time has elapsed.

According to another exemplary embodiment of the present disclosure, there is provided a magnetic annealing method of annealing a plurality of substrates in a magnetic field. The method includes carrying a plurality of substrates into a processing container using a substrate holder that holds the plurality of substrates substantially horizontally such that the plurality of substrates are stacked vertically and has an upper surface and a lower surface of the substrate holder covered by a heat shielding plate, the processing container being surrounded outward by a division heater including at least four sub-division heaters covering regions including an upper portion, a lower portions, and both side portions; heating the sub-division heaters in the upper and lower portions at an output higher than an output of the sub-division heaters the both side portions; and reducing the output of the sub-division heaters in the upper and lower portions to substantially the same level as the output of the sub-division heaters in the both side portions.

In the magnetic annealing method described above, the output of the sub-division heaters in the both side portions is controlled by a feedback control. The output of the sub-division heaters in the upper and lower portions is controlled by multiplying the output of the sub-division heaters in the both side portions and a predetermined ratio.

In the magnetic annealing method described above, the predetermined ratio is variable so as to be set to a value larger than 1 in the heating the sub-division heaters and a value approximate to 1 in the reducing the output of the sub-division heaters.

According to the present disclosure, an early convergence from the start of heating to the temperature stabilization may be achieved.

Hereinafter, exemplary embodiments of the present disclosure will be described with reference to accompanying drawings.

First, descriptions will be made on a configuration of a magnetic annealing apparatus 230 including a wafer boat.

FIG. 1 is a cross-sectional view illustrating the whole configuration of the magnetic annealing apparatus 230. The magnetic annealing apparatus 230 includes an annealing furnace 180 and a magnet 190. As illustrated in FIG. 1, for example, the magnet 190 is installed to cover an outer periphery of a surface of the annealing furnace 180 that extends in a longitudinal direction. The magnet 190 may be any magnet as long as it is a means capable of generating a uniform magnetic field of a predetermined direction (e.g., a front-rear direction) in a region where wafers W are held in the annealing furnace 180. However, the magnet 190 may be for example, a solenoid type magnet as described above.

The annealing furnace 180 includes a processing container 100, a heater 110, a heater supporting metal plate 120, a heat insulator 130, a water cooled jacket 140, a flange 150, an O-ring 160, a thermocouple 170, and a quartz glass tube 175. Further, the annealing furnace 180 is configured to accommodate a cap 60, a wafer boat support 61, and a wafer boat 70 in the processing container 100. Meanwhile, the wafer boat 70 is configured to hold wafers W.

The processing container 100 is a container that accommodates the wafer boat 70 and performs a magnetic annealing processing. The processing container 100 has a horizontally-elongated tubular shape. The processing container 100 may have any horizontally-elongated tubular shape, but may be configured in, for example, cylindrical shape. The processing container 100 may be configured as, for example, a quartz tube made of quartz.

The heater 110 is a means for heating the wafers W, which is installed outside the processing container 100 and is longer than the wafer boat 70 so as to cover the wafer boat 70 in the longitudinal direction of the processing container 100. The heater 110 is installed along the longitudinal direction so as to cover the surface of the processing container 100 extending in the longitudinal direction. Meanwhile, the heater 110 is not installed in places covering both ends of the cylindrical processing container 100 from the viewpoint of securing a carrying-in/out path of the wafer boat 70 and a vacuum exhaust path.

The heater supporting metal plate 120 is a metal plate for supporting the heater 110 and attached with the heater 110. The heat insulator 130 is a member for confining heat radiated from the heater 110 inside, thereby preventing the heat from emitting to the outside where the magnet 190 is present. The heat insulator 130 is installed so as to cover the outer periphery of the heater supporting metal plate 120. The water-cooled jacket 140 is installed to prevent the temperature of the annealing furnace 180 from excessively increasing, and is installed so as to cover the outer periphery of the heat insulator 130. The water-cooled jacket 140 includes an inner double pipe 141 and an outer double pipe 143 so that a coolant 142 circulates between the inner double pipe 141 and the outer double pipe 143. The coolant 142 may be, for example, cold water or any other coolant. With such a configuration, radiation of the heat to the magnet 190 may be reduced.

The flange 150 is installed to appropriately fix the processing container 100, and holds the processing container 100 via the O-ring 160. The O-ring 160 is also installed in other places as necessary to airtightly fix such places.

The thermocouple 170 is a temperature detecting means for measuring a temperature around the wafers W in the processing container 100, and installed to perform a temperature control. As described in detail later, in the magnetic annealing apparatus 230 and the magnetic annealing method according the present exemplary embodiment, the temperature control is performed on a part of the heater 110 by a feedback control. The feedback control of the temperature of the heater 110 is performed based on a temperature detected by the thermocouple 170. Meanwhile, as illustrated in FIG. 1, the thermocouple 170 may be installed to be held in, for example, the quartz pipe 175. Further, the thermocouple 170 may be an N-type thermocouple that is strong in the magnetic field.

Meanwhile, FIG. 1 illustrates an example of using the thermocouple 170 as a temperature detector. However, various temperature detectors may be used as long as it is possible to detect the temperature around the wafers W in the processing container 100.

The inside of the processing container 100 is open at the front end side of the wafer boat 70 (opposite side of the cap 60), and evacuation is accomplished through the opening. Since the magnetic annealing processing is performed under a high vacuum, the inside of the processing container 100 is evacuated by, for example, a turbo molecular pump and maintained at a high vacuum of, for example, about $5\times10^{-7}$ Torr.

Figure 2:
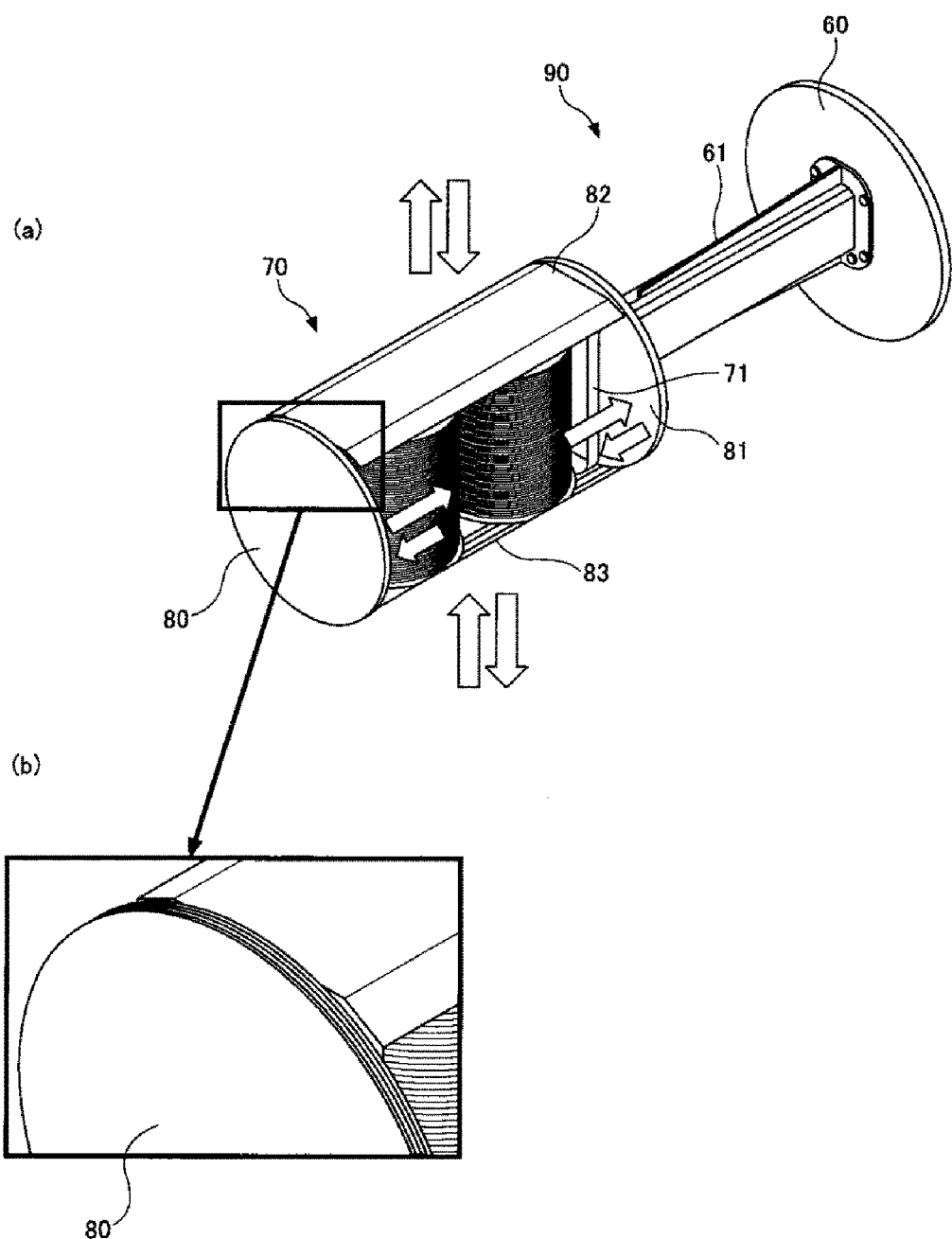
FIG. 2 is a view illustrating an exemplary configuration of a boat loader.

FIG. 2 is a view illustrating an exemplary configuration of the boat loader 90 of the magnetic annealing apparatus 230 according to the exemplary embodiment of the present disclosure. In FIG. 2, (a) is a perspective view illustrating the entire configuration of the boat loader 90, and (b) is a view illustrating a configuration of a heat shielding plate in an enlarged scale.

In (a) of FIG. 2, the boat loader 90 includes the cap 60, the wafer boat support 61, the wafer boat 70, and heat shielding plates 80 to 83. When the magnetic annealing processing is performed by the magnetic annealing apparatus 230, the heat shielding plates 80 to 83 prevent dissipation of heat from the heater 110 and temperature unevenness due to radiation of heat concentrated on a predetermined place, thereby facilitating uniformity of the heat radiated to the wafers W. The heat shielding plates 80 to 83 are installed to cover the periphery of the wafer boat 70. Specifically, the heat shielding plates 80 and 81 are installed to cover both ends of the wafer boat 70 in a longitudinal direction, and the heat shielding plates 82 and 83 are installed to cover the upper surface and the lower surface of the wafer boat 70, respectively.

As illustrated in FIG. 1, since the heater 110 is installed to cover a surface of the processing container 100 that extends in the longitudinal direction and is not installed at both sides of the processing container 100, the heat shielding plates 80 and 81 installed at both ends of the wafer boat 70 in the longitudinal direction play a role to prevent heat dissipation. Meanwhile, in FIG. 2, since the wafers W are placed horizontally and stacked vertically, the uppermost wafer W and the lowermost wafer W in the stack are directly subjected to heat radiation from the heater 110, so that the temperature difference from the wafers W in the middle of the stack increases. Therefore, when the wafers W are placed horizontally and stacked vertically, the heating shielding plates 82 and 83 are installed to cover the wafers W at the upper and lower surfaces of the wafer boat 70 such that the heat from the heater 110 is shielded and reflected. This makes it possible to facilitate soaking of the stacked wafers W and evenly heat the wafers W.

Meanwhile, in a case where the wafers W are held like books on a bookshelf with predetermined intervals in a lateral direction by the wafer boat 70 while the wafers W stand vertically, there is less concern about concentration of the heat from the heater 110 on predetermined places (the uppermost and lowermost surfaces) as in the case where the wafers W are held horizontally, because all the wafer W are heated in a direction from the whole outer periphery to the center thereof. Therefore, in such a case, it is not necessary to install the heat shielding plates 82 and 83 on the upper surface and the lower surface of the wafer boat 70, and it is sufficient to install the heat shielding plates 80 and 81 for heat insulation at the both sides of the wafer board 70. However, since the magnetic annealing apparatus 230 and the magnetic annealing method according to the present exemplary embodiment are applied to an in-plane magnetization method, it is desirable to install the heat shielding plates 82 and 83 even on the upper surface and the lower surface of the wafer boat 70 when a temperature difference among the upper tiers, the middle tires, and the lower tiers of the wafers occurs due to the heat radiation of the heater 110.

The shielding plates 80 to 83 are not-magnetic, and may be made of various materials, for example, a non-magnetic metal material as long as the heat shielding effect is high. For example, stainless steel and titanium may be appropriately used for the heat shielding plates 80 to 83.

As illustrated in (b) of FIG. 2, the heat shielding plate 80 may be constituted by laminating a plurality of thin plates. In (b) of FIG. 2, for example, four sheets of non-magnetic thin metal plates are laminated and constitute one heat shielding plate 80. Meanwhile, when thin metal plates are laminated, for example, spacers may be interposed to laminate a plurality of thin metal plates with predetermined intervals. Further, as illustrated in (b) of FIG. 2, the heat shielding plate 825 on the upper surface may be formed with, for example, engaging holes to engage with projections of the wafer boast 70, as necessary.

[Configuration of Heater]

Figure 3A:
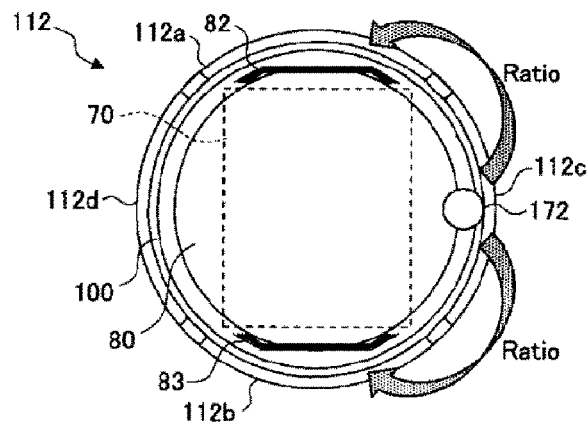
FIGS. 3A to 3C are views illustrating a relationship between a heater 110 and a processing container 100 in a magnetic annealing apparatus 230 according to an exemplary embodiment of the present disclosure.
Figure 3B:
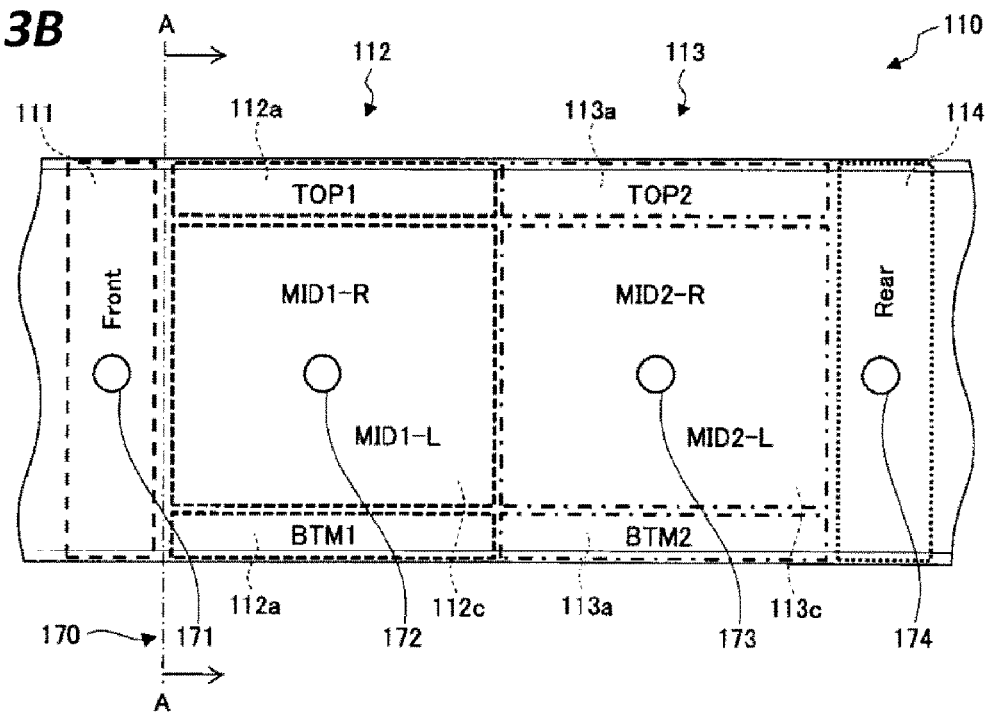
Figure 3C:
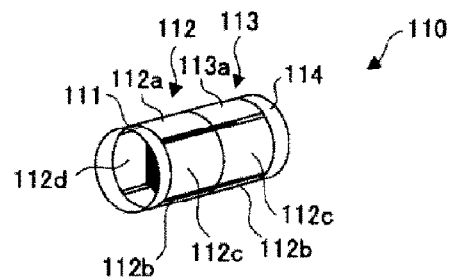

FIGS. 3A to 3C are views illustrating a relationship between the heater 110 and the processing container 100 in the magnetic annealing apparatus 230 according to an exemplary embodiment of the present disclosure. FIG. 3A is a front view of the inside of the heater of the magnetic annealing apparatus according to the exemplary embodiment. FIG. 3B is a side view of the heater of the magnetic annealing apparatus according to the exemplary embodiment. FIG. 3C is a perspective view of the inside of the heater of the magnetic annealing apparatus according to the exemplary embodiment. More specifically, FIG. 3A is a front view of the inside of the heater 112 of the magnetic annealing apparatus 230 when viewed in the arrow direction from the A-A cross-section.

As illustrated in FIG. 3B and FIG. 3C, the heater 110 of the annealing apparatus according to the present exemplary embodiment includes four heaters 111, 112, 113, 114 covering four regions along the longitudinal direction. Further, the heater 111 at the front side and the heater 114 at the rear side cover the entire circumference of the processing container 100 with one heater 111, 114, respectively. However, as illustrated in FIGS. 3A to 3C, the heaters 112 and 113 in the central region are configured to cover the entire circumference of the processing container 100 with division heaters 112a to 112d, 113a to 113d divided to four regions including an upper surface, a lower surface, a right surface, and a left surface, respectively. That is, four predetermined regions of the processing container 100 along the longitudinal direction are covered with four-pieced heaters 111 to 114. With respect to the central region, the entire circumferential surface of the region of the heater 112 is covered with four-pieced division heaters 112a to 112d. Likewise, the entire circumferential surface of the region of the heater 113 is covered with four-pieced division heaters 113a to 113d. Therefore, the heating region is covered with ten heaters 111, 112a to 112d, 113a to 113d, 114 in total.

Further, the thermocouple 170 that functions as a temperature detector includes four thermocouples 171 to 174 corresponding to the four heaters 111 to 114 in the longitudinal direction. That is, it is configured to perform the temperature control by the feedback control for each region covered by the heaters 111 to 114 in the longitudinal direction.

The heaters 111, 114 at both ends cover the entire circumference of the processing container 100 with one heater 111, 114, respectively. Since the thermocouples 171, 174 have one-to-one relationship with the respective heaters 111, 114, respectively, the temperature control by the feedback control is performed individually on each of the heaters 111, 114.

Meanwhile, since the heaters 112, 113 in the central region covers the upper surface, the right surface, the lower surface, and the left surface of the processing container 100 with four-pieced division heaters 112a to 112d, 113a to 113d, respectively, it is possible to perform a different control depending on regions of the circumferential surface. However, the thermocouples 172, 173 correspond to the heaters 112, 113 one by one, and a configuration of performing a feedback control individually for each region is not adopted.

As illustrated in FIG. 3A, in the heater 112 of the magnetic annealing apparatus 230 according to the present exemplary embodiment, the feedback control is performed on the division heater 112c on the right surface of the processing container 100 which is installed closest to the thermocouple 172 and the division heater 112d on the left surface which is symmetric thereto with respect to the center of the wafer W, among the four-pieced division heaters 112a to 112d. Meanwhile, on the division heaters 112a, 112d installed on the upper surface and the lower surface of the processing container 100, a ratio control is performed to output, as a control output, a value obtained by multiplying a control output of the feedback control and a predetermined ratio. Such a control is performed for a case where the wafer W stacked vertically on the wafer boat 70 is subjected to the magnetic annealing processing at an elevated temperature immediately after starting the heating while increasing the output of the division heaters 112a, 112b on the upper surface and the lower surface. Otherwise, it has been confirmed experimentally that the temperatures of the upper tiers, the middle tiers, and the lower tiers of the stacked wafers W are not uniformly increased. Meanwhile, when the output of the division heater 112a on the upper surface and the division heater 112b on the lower surface is high, it is considered that the temperatures of the wafers W on the uppermost surface and the lowermost surface of the stack may be excessively increased. Thus, the heat shielding plates 82, 83 are installed on the upper surface and the lower surface of the wafer boat 70 to cover the wafers W on the uppermost surface and the lowermost surface, thereby suppressing the heat from being irradiated directly from the heater 110. Accordingly, even though the output of the division heaters 112a, 112b on the upper surface and the lower surface is high, the heat imparted to the upper and lower regions as a whole may be relatively increased as compared with that in the middle tier region while suppressing direct radiation to the wafers W on the uppermost surface and the lowermost surface, thereby uniformly increasing the temperature of the wafers W in entirety.

Meanwhile, since unevenness of the temperature of the wafers W is a phenomenon only when increasing the temperature, the ratio control is performed to increase the output of the division heaters 112a, 112b on the upper surface and the lower surface only when increasing the temperature. When the temperature is stabilized, the ratio control is canceled, and the division heaters 112a, 112b on the upper surface and the lower surface may be returned to the feedback control in the same manner as in the division heaters 112c, 112d on the left and right surfaces. That is, it is possible to perform the ratio control as necessary, and stop the ratio control when no longer necessary.

Meanwhile, the predetermined ratio by which the control output of the feedback control is multiplied when performing the ratio control may be determined by, for example, a recipe in advance, and may be freely changed depending on the process. For example, when the ratio is set to 1.5, the division heaters 112a, 112d on the upper surface and the lower surface are subjected to heating with an output 1.5 times the division heaters 112c, 112d on left and right surfaces. The predetermined ratio may be set to a proper value within a range of 1.2 to 1.8 or 1.4 to 1.6.

The control output supplied to the heater 110 may be, for example, a power supplied to the division heaters 112a to 112d. That is, the heating temperature of the division heaters 112a to 112d may be controlled depending on the magnitude of the power to be supplied. Meanwhile, the control output is not limited to the power, and may be selected from output values suitable for easily performing a temperature control of the division heaters 112a to 112d, depending on the applications.

Further, the ratio control may be performed on the heater 113 in the central region as well in the same manner. Specifically, based on the temperature detected by the thermocouple 172 installed near the right surface of the processing container 100, a feedback control is performed on the division heater 113c on the right surface and the division heater 113d on the left surface. The division heater 113a on the upper surface and the division heater 113b on the lower surface are supplied with, as a control output, a predetermined value obtained by multiplying the control output of the division heaters 113c, 113d on the left and right surfaces and the predetermined ratio.

Meanwhile, the predetermined ratios for the heater 112 and the heater 113 are generally the same ratio. However, when a difference in, for example, a special temperature characteristic between the heaters 112, 113 is found, a separate ratio setting may be performed in consideration of the difference.

Thereafter, in order to clearly distinguish between the heaters 112, 113 divided in the central region and the heater 111, 114 not divided at both ends, the heaters 112, 113 may be referred to as division heaters 112, 113, and the heaters 111, 114 may be referred to as surrounding heaters 111, 114.

Further, in FIGS. 3A to 3C, only the heaters 112, 113 in the central region are constituted with division heaters 112a to 112d, 113a to 113d, and the heaters 111, 114 at both ends are not constituted as division heaters. This is because the wafers W are placed just below the heaters 112, 113 in the central region, so that the influence of the heaters 112, 113 in the central region on the wafers W is larger than that of the heaters 111, 114 at both ends. This configuration makes it possible to perform a finer control. If necessary, however, the heaters 111, 114 at both ends may be constituted as division heaters so as to perform the ratio control. On the contrary, when installation of one large division heater is sufficient for the entire central region, the heaters 112, 113 may be unified as one division heater. The combination of the division heaters 112, 113 that perform the ratio control and the surrounding heaters 111, 114 that perform an individual control may be changed depending on the applications.

[Configuration of Heater Control]

Figure 4:
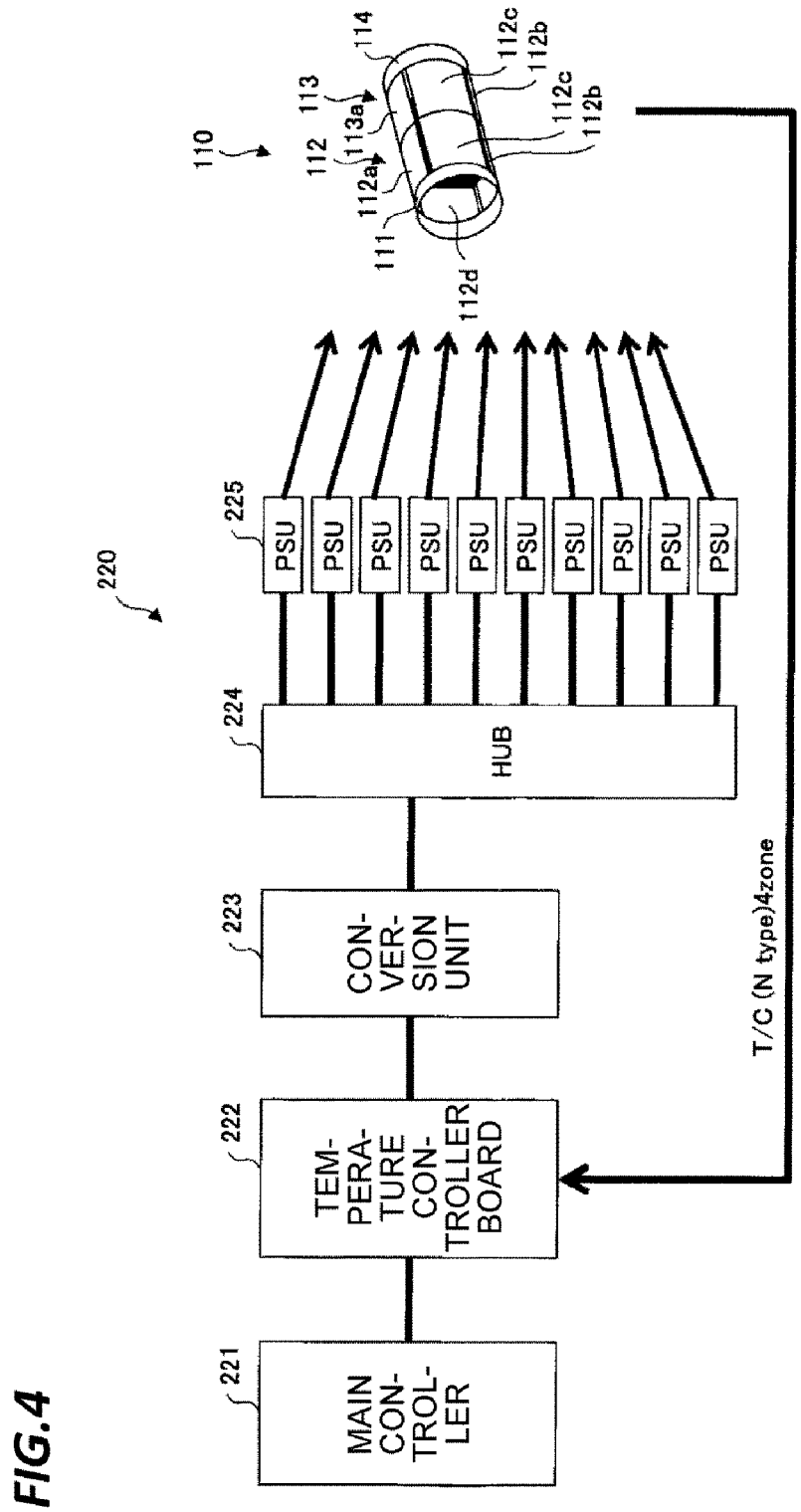
FIG. 4 is a view illustrating an exemplary heater control configuration of the magnetic annealing apparatus 230 according to an exemplary embodiment of the present disclosure.

FIG. 4 is a view illustrating an exemplary heater control configuration of the magnetic annealing apparatus 230 according to an exemplary embodiment of the present disclosure. The magnetic annealing apparatus 230 includes a heater controller 220 that performs a temperature control of the heater 110.

The heater controller 220 is a means for performing an entire control of the heater 110 including the temperature control of the heater 110. The heater controller 220 includes a main controller 221, a temperature control board 222, a conversion board 223, a hub 224, and power controllers 225.

The main controller 221 is a control means for determining a ratio necessary for performing the ratio control.

The temperature control board 222 is a control means for receiving a temperature detection signal from the thermocouple 170 and, based on this, performing a temperature control by a feedback control of the heater 110. Accordingly, the temperature control board 222 is electrically connected to the thermocouple 170. The feedback control target heaters, which are subjected to the feedback-control, are, for example, the division heaters 112c, 113c installed to cover the right surface of the processing container 100 and the division heaters 112d, 113d installed to cover the left surface thereof, among the division heaters 112, 113 in the central region illustrated in FIG. 4.

The conversion board 223 is a board for converting the output of EtherCAT output from the temperature control board 222 to EtherNet (registered trademark). That is, the conversion board 223 converts the control output of EtherCAT output from the temperature control board 222 to EtherNet. Meanwhile, the temperature control board 222 and the conversion board 223 may be connected via EtherCAT, for example.

The hub 224 is a power distribution means for gathering the control output supplied from the conversion board 223 and distributing and supplying the control output to the power controllers 225 corresponding to the respective heaters 111, 112a to 112d, 113a to 113d, 114 including ratio target control heaters. Meanwhile, the ratio target control heaters are heaters other than the feedback control target heaters of the division heaters 112, 113. Specifically, the ratio target control heaters are the division heaters 112a, 113a installed to cover the upper surface of the processing container 100 and the division heaters 112b, 113b installed to cover the lower surface. Further, the conversion board 223 and the hub 224 may be connected via EtherNet, for example.

The power controllers 225 are power control means for supplying the power supplied from the hub 224 to the respective heaters 111, 112a to 112d, 113a to 113d, 114. Meanwhile, when the power from the hub 224 is supplied as an AC power, the power controllers 225 may be configured as AC/DC converters to covert the AC power into a DC power. Meanwhile, the AC/DC converter may be commercially available. Further, the hub 224 and the power controllers 225 may be connected via EtherNet, for example.

Figure 5:
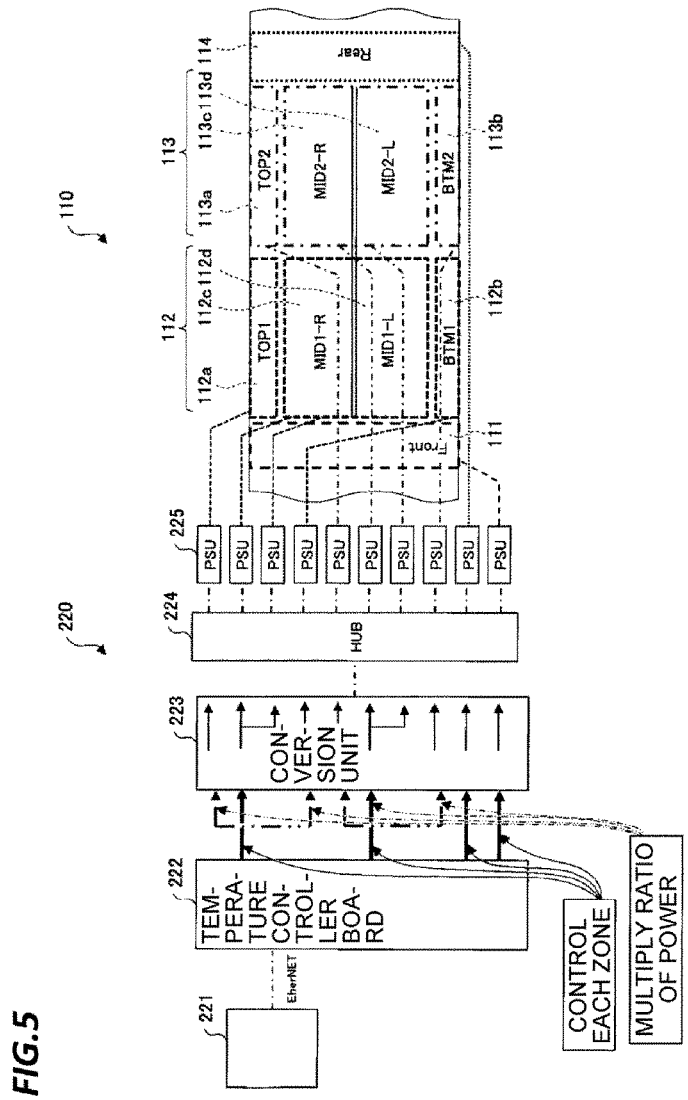
FIG. 5 is a view for describing a heater control of the magnetic annealing apparatus 230 according to an exemplary embodiment of the present disclosure in detail.

FIG. 5 is a view for describing a heater control of the magnetic annealing apparatus 230 according to an exemplary embodiment of the present disclosure in detail. In FIG. 5, the configuration of the heater controller 220 illustrated in FIG. 4 and the configuration of the heater 110 illustrated in FIGS. 3A to 3C are illustrated. That is, in FIG. 5, detailed descriptions will be made on how the heater controller 220 illustrated in FIG. 4 perform the temperature control of the heater 110 illustrated in FIGS. 3A to 3C.

First, the heater 110 supplied with the power from the power controllers 225 includes the surrounding heaters 111, 114 at both ends and the division heaters 112, 113 in the central region. Since each of the division heaters 112, 113 is divided to four pieces of division heaters 112a to 112d, 113a to 113d, there are ten heaters 111, 112a to 112d, 113a to 113d, 114 in total. This is consistent with the figure in which ten power controllers 225 are installed to correspond to the above-described ten heaters 111, 112a to 112d, 113a to 113d, 114 one by one and supply power thereto in FIG. 5.

Among these, since a common power command is received between the division heaters 112c, 112d and between the division heaters 113c, 113d, which are installed in the central region to cover the left and right surfaces of the processing container 100, there are eight power commands output from the temperature control board 222 to the conversion board 223. This is consistent with the fact that there are eight left-sided arrows directing from the conversion board 223 toward the hub 224 in FIG. 5.

Further, the temperature control board 222 controls only four regions along the longitudinal direction. This is consistent with the fact that there are four arrows directing from the temperature control board 222 toward the conversion board 223 in FIG. 5. That is, among the eight points to be input to the conversion board 223, four points receives the power command directly from the temperature control board 222. The power command is a power command by the feedback control based on the thermocouple 170.

Meanwhile, among the eight points to be input to the conversion board, the remaining four points correspond to the division heaters 112a, 112b, 113a, 113b installed above and below the central region, which are controlled with a ratio with respect to the division heaters 112c, 112d, 113c, 113d installed at left and right sides in the same region in the longitudinal direction. That is, the power command is calculated by multiplying the above-described power command by the feedback control and a predetermined ratio. The predetermined ratio may be set from a recipe.

In the magnetic annealing apparatus 230 according to the present exemplary embodiment, the temperature control board 222 first feedback-controls the power of the heater 110 to control the heater temperature based on the temperature detection value from the thermocouple 170. At this time, the control number is reduced by condensing heaters 110 to be controlled without controlling all heaters 110, and simply multiplying a basic heater control value and a ratio with respect to the remaining heaters 110, thereby realizing a simple temperature control.

In the magnetic annealing method according to the present exemplary embodiment, the ratio control is performed such that the temperatures of all the plurality of heaters 111 to 114 are increased at the same temperature gradient using a high ratio (e.g., 1.5) at the beginning of the annealing. When the temperature increase is completed and the temperatures become constant, a steady-state control is performed by setting the ratio a value approximate to 1. By performing such a control, the time from the start of the annealing to the temperature stabilization may be reduced, thereby realizing an early convergence of the temperature stabilization.

Figure 6:
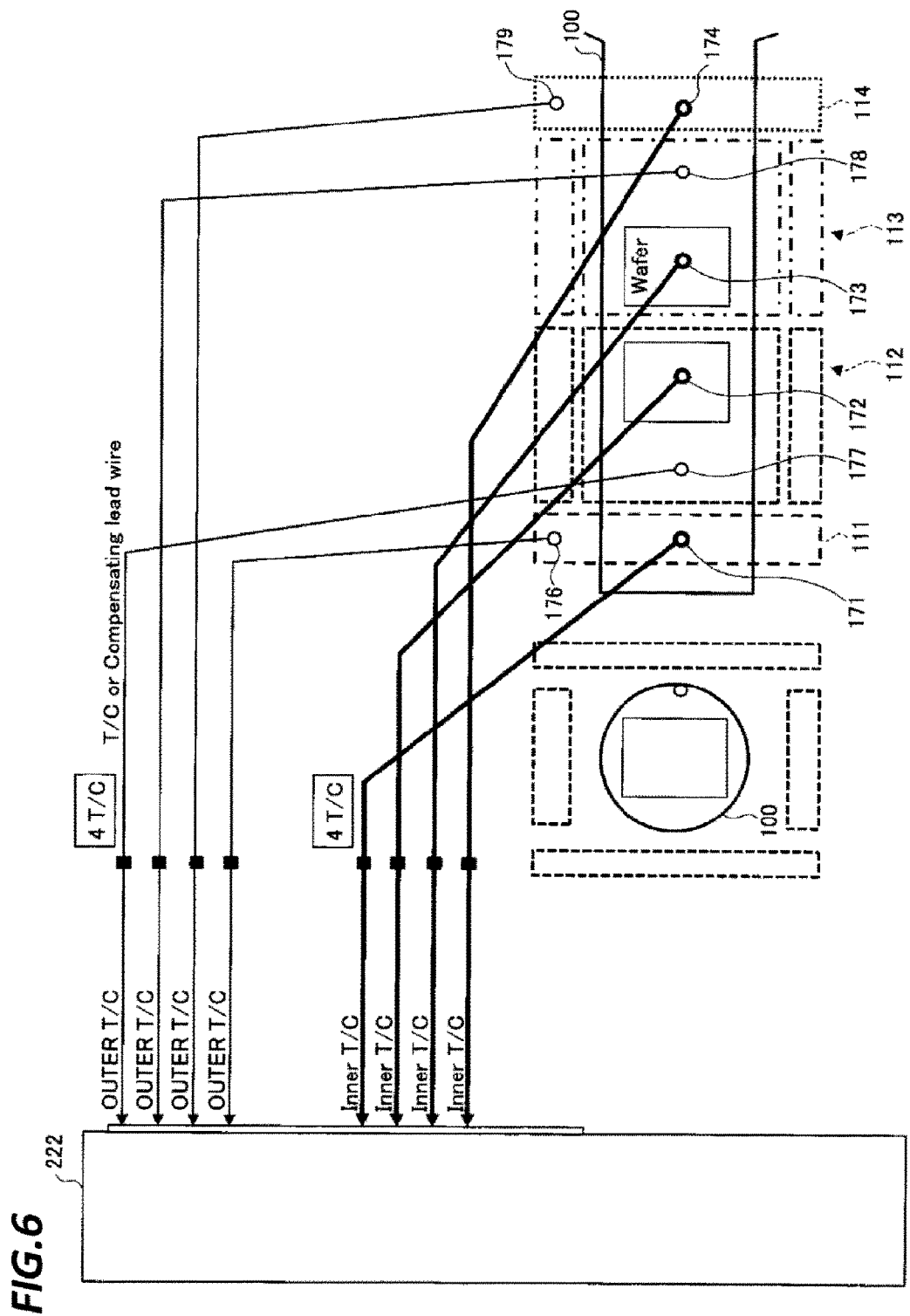
FIG. 6 is a view illustrating an exemplary flow of a temperature detection signal transmitted from a thermocouple to a temperature control board.

FIG. 6 is a view illustrating an exemplary flow of a temperature detection signal transmitted from the thermocouple 170 to the temperature control board 222.

In FIG. 6, thermocouples 171 to 174 are installed near the inner periphery of the processing container 100 along the longitudinal direction to correspond to the respective heaters 111 to 114. The detection signal is transmitted as a temperature detection signal to the temperature control board 222, and the temperature control of the heaters 111 to 114 is performed based on this, as described so far.

In addition to the thermocouples 171 to 174, thermocouples 176 to 179 for compensation may be also installed, but at different positions from the thermocouples 171 to 174 to correspond to the respective heaters 111 to 114. Since they are thermocouples 176 to 179 for compensation and are installed at different positions from the thermocouples 171 to 174, the temperature information of the respective heating ranges in charge of the heaters 111 to 114 is obtained from different positions, thereby achieving rationalization of the temperature detection information required for the control of the heaters 111 to 114.

As such, the thermocouples 176 to 179 for compensating the temperature detection may be installed as necessary.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A magnetic annealing apparatus comprising:
a processing container having a horizontally-elongated tubular shape and configured to perform a magnetic annealing processing on a plurality of substrates accommodated therein in a magnetic field;
a substrate holder configured to hold the plurality of substrates substantially horizontally in the processing container such that the plurality of substrates are stacked vertically;
a division heater including a plurality of sub-division heaters that cover an upper surface, a lower surface, a right side surface, and a left side surface of the processing container and configured to cover a substantially entire circumferential surface of an outer periphery of a predetermined region of the processing container along a longitudinal direction with the plurality of sub-division heaters;
a magnet installed to cover an outside of the division heater; and
a controller configured to feedback-control a temperature of a first sub-division heater that covers at least one of the right side surface and the left side surface of the processing container among the plurality of sub-division heaters, and to control a temperature of a second sub-division heater that covers at least one of the upper surface and the lower surface of the processing container by multiplying a control output of the first sub-division heater and a predetermined ratio.

2. The magnetic annealing apparatus of claim 1, wherein a plurality of division heaters is installed in the longitudinal direction, and
the first sub-division heater is selected for each predetermined region along the longitudinal direction.

3. The magnetic annealing apparatus of claim 1, wherein the temperature of the first sub-division heater is feedback-controlled based on a temperature detection result of a temperature detector installed in the processing container.

4. The magnetic annealing apparatus of claim 3, wherein the temperature detector is installed at a position closest to the first sub-division heater.

5. The magnetic annealing apparatus of claim 1, wherein the control output is an output that controls a heater power of each of the plurality of sub-division heaters.

6. The magnetic annealing apparatus of claim 5, wherein the controller includes:
a temperature control unit configured to control the heater power of the first sub-division heater by a feedback control; and
an output conversion unit configured to perform an output conversion by multiplying the heater power of the first sub-division heater and the predetermined ratio.

7. The magnetic annealing apparatus of claim 1, further comprising:
a surrounding heater configured to surround the entire circumference of the processing container at both ends of the division heater in the longitudinal direction,
wherein the controller feedback-controls a temperature of the surrounding heater.

8. The magnetic annealing apparatus of claim 1, further comprising:
a heat shielding plate arranged to cover an upper surface and a lower surface of the substrate holder and configured to shield heat from the second sub-division heater, wherein the controller is further configured to set the predetermined ratio of the second sub-division heater to a value larger than 1 at the beginning of a magnetic annealing processing.

9. The magnetic annealing apparatus of claim 8, wherein the controller sets the predetermined ratio to 1 when a predetermined time has elapsed.

10. A magnetic annealing method of annealing a plurality of substrates in a magnetic field, the method comprising:
   carrying a plurality of substrates into a processing container using a substrate holder that holds the plurality of substrates substantially horizontally such that the plurality of substrates are stacked vertically and has an upper surface and a lower surface of the substrate holder covered by a heat shielding plate, the processing container being surrounded outward by a division heater including at least four sub-division heaters covering regions including an upper portion, a lower portions, and both side portions;
   heating the sub-division heaters that cover the upper and lower portions at an output higher than an output of the sub-division heaters that cover the both side portions; and
   reducing the output of the sub-division heaters that cover the upper and lower portions to substantially the same level as the output of the sub-division heaters that cover the both side portions,
   wherein, in the heating the sub-division heaters that cover the upper and lower portions, the output of the sub-division heaters that cover the both side portions is controlled by a feedback control, and the output of the sub-division heaters that cover the upper and lower portions is controlled by multiplying the output of the sub-division heaters that cover the both side portions and a predetermined ratio.

11. The magnetic annealing method of claim 10, wherein the predetermined ratio is variable so as to be set to a value larger than 1 in the heating the sub-division heaters that cover the upper and lower portions and a value approximate to 1 in the reducing the output of the sub-division heaters that cover the upper and lower portions.

12. The magnetic annealing apparatus of claim 2, wherein, when there is a difference in a temperature characteristic between the plurality of the division heaters installed in the longitudinal direction, a ratio for each of the second sub-division heater that covers at least one of the upper surface and the lower surface of the processing container is determined in consideration of the difference.

13. The magnetic annealing apparatus of claim 1, wherein the predetermined ratio is set to a value within a range of 1.2 to 1.8 or 1.4 to 1.6.

14. The magnetic annealing apparatus of claim 1, wherein the predetermined ratio is set to about 1.5.

* * * * *